(12) United States Patent
Miao et al.

(10) Patent No.: US 11,196,001 B2
(45) Date of Patent: Dec. 7, 2021

(54) 3D RERAM FORMED BY METAL-ASSISTED CHEMICAL ETCHING WITH REPLACEMENT WORDLINE AND WORDLINE SEPARATION

(71) Applicant: International Business Machines Corporation, Armonk, NY (US)

(72) Inventors: Xin Miao, Slingerlands, NY (US); Kangguo Cheng, Schenectady, NY (US); Wenyu Xu, Albany, NY (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 16/698,450

(22) Filed: Nov. 27, 2019

(65) Prior Publication Data

US 2021/0159409 A1 May 27, 2021

(51) Int. Cl.
  *H01L 45/00* (2006.01)
  *H01L 27/24* (2006.01)
(52) U.S. Cl.
  CPC ........ *H01L 45/1691* (2013.01); *H01L 27/249* (2013.01); *H01L 27/2454* (2013.01); *H01L 45/08* (2013.01); *H01L 45/146* (2013.01)
(58) Field of Classification Search
  CPC ..... H01L 45/06; H01L 45/08; H01L 45/1233; H01L 45/146; H01L 45/1666; H01L 45/1691; H01L 27/249; H01L 27/2454
  See application file for complete search history.

(56) References Cited

U.S. PATENT DOCUMENTS

| | | | |
|---|---|---|---|
| 6,790,785 B1 | 9/2004 | Li et al. | |
| 7,910,914 B2* | 3/2011 | Tanaka | H01L 27/2409 257/5 |
| 8,173,987 B2* | 5/2012 | Lung | H01L 45/1641 257/2 |
| 8,278,191 B2 | 10/2012 | Hildreth et al. | |
| 9,437,441 B2 | 9/2016 | Oh et al. | |
| 9,911,790 B1* | 3/2018 | Shimabukuro | H01L 45/147 |
| 10,134,634 B2 | 11/2018 | Li et al. | |
| 2015/0376798 A1 | 12/2015 | Sakdinawat et al. | |
| 2018/0090373 A1* | 3/2018 | Sharangpani | H01L 27/11524 |

OTHER PUBLICATIONS

Li, X., et al., "Metal-assisted chemical etching in HF/H2O2 produces porous silicon", Applied Physics Letters, Oct. 16, 2000, pp. 2572-2574, vol. 77, No. 16.
Geyer, N., et al., "Sub-20 nm Si/Ge Superlattice Nanowires by Metal-Assisted Etching", Nano Letters, Revised Manuscript, pp. 3106-3110, vol. 9, No. 9.

* cited by examiner

*Primary Examiner* — Allison Bernstein
(74) *Attorney, Agent, or Firm* — Scully, Scott, Murphy & Presser, P C.; L. Jeffrey Kelly, Esq.

(57) ABSTRACT

Metal-assisted chemical etching is employed to form a three-dimensional (3D) resistive random access memory (ReRAM) in which the etching aspect ratio limit is extended and the top trench and bottom trench CD uniformity is improved. The 3D ReRAM includes a metal catalyst located between a bitline electrode and a selector device. Further, the 3D ReRAM includes vertically stacked and spaced apart replacement wordline electrodes that are located adjacent to the bitline electrode.

9 Claims, 7 Drawing Sheets

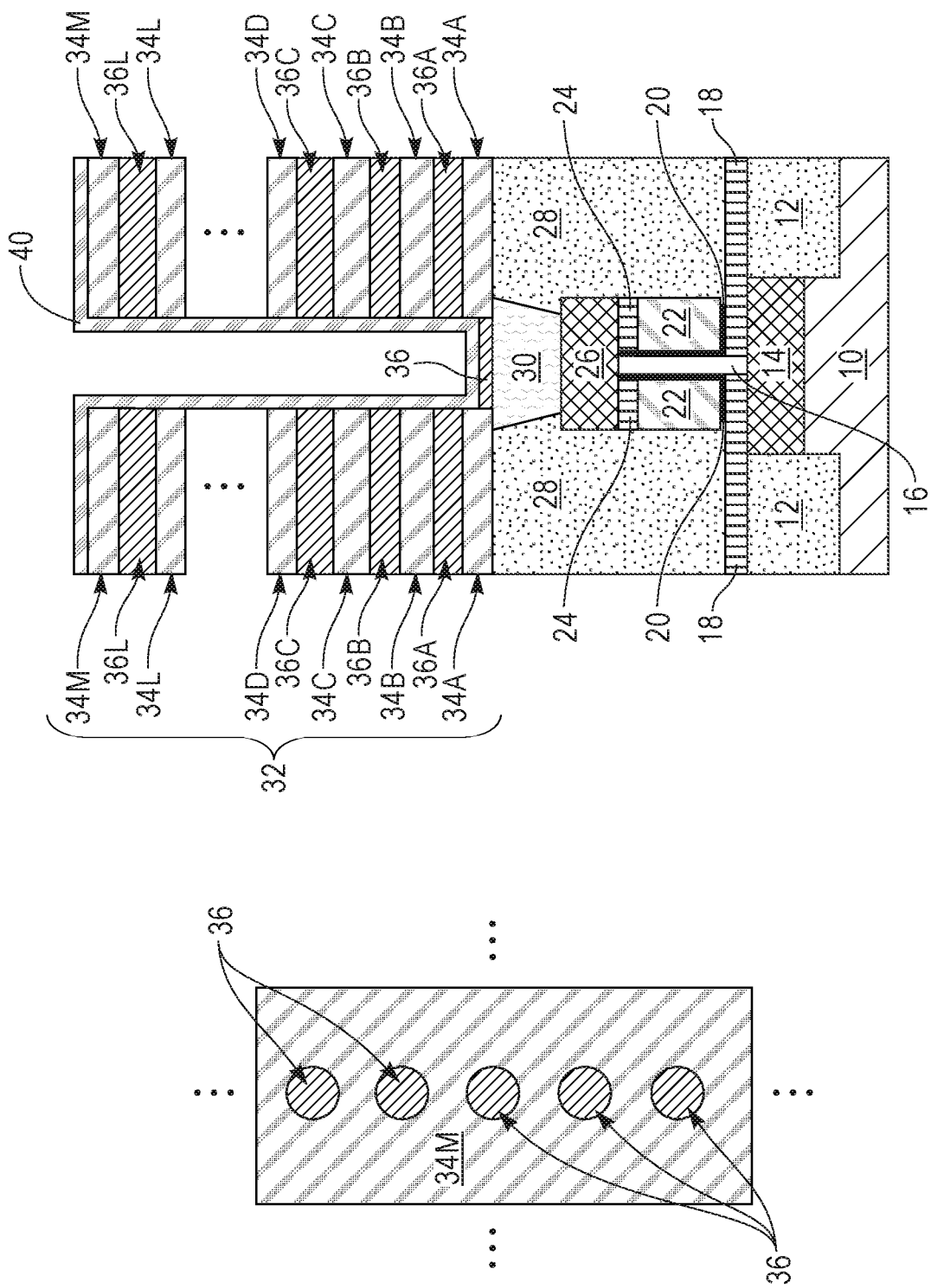

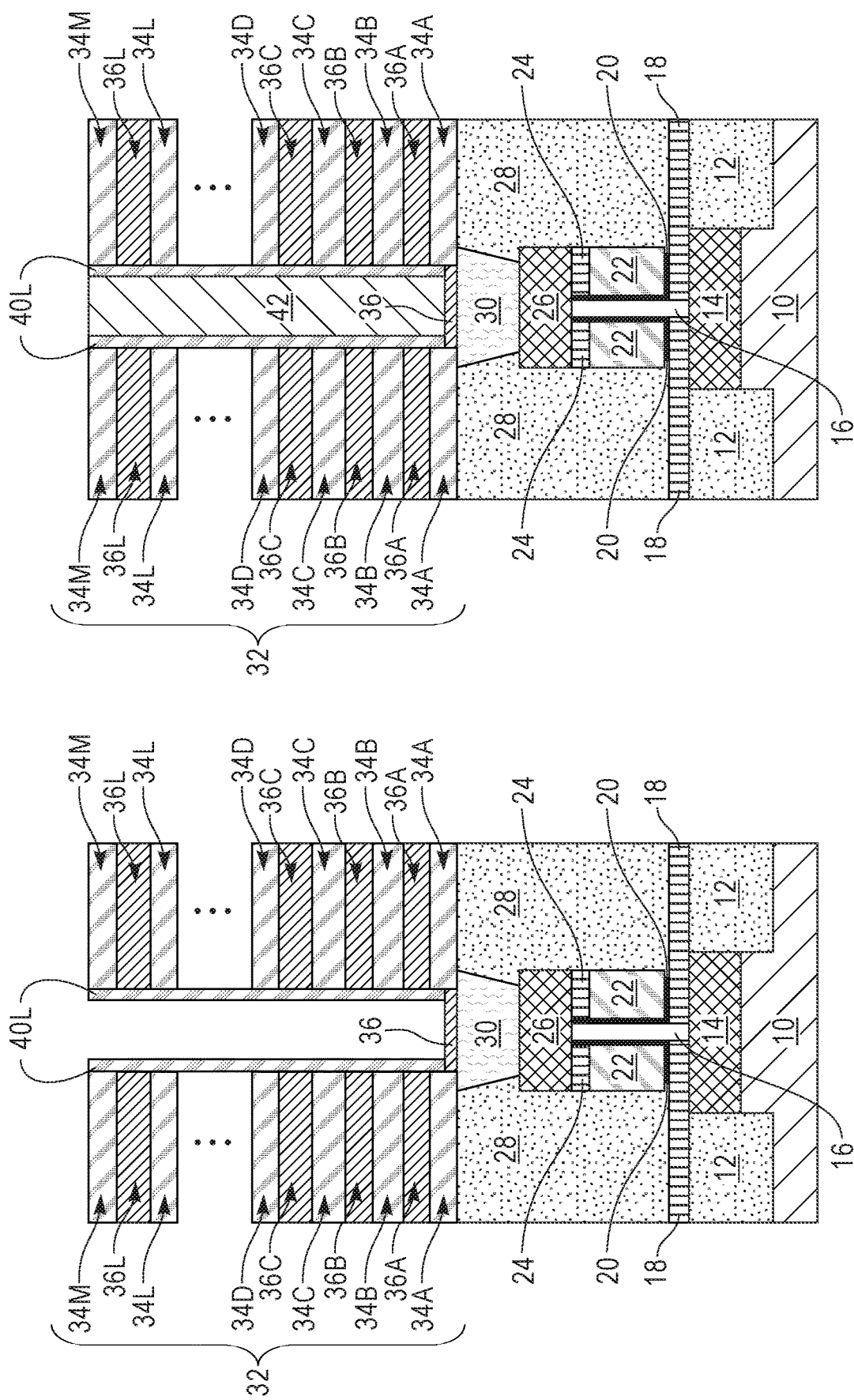

3D RERAM FORMED BY METAL-ASSISTED CHEMICAL ETCHING WITH REPLACEMENT WORDLINE AND WORDLINE SEPARATION

BACKGROUND

The present application relates to a memory structure, and more particularly to a three-dimensional (3D) resistive random access memory (ReRAM) and a method of forming the same.

A ReRAM is a type of non-volatile random access memory that works by changing the resistance across a dielectric solid-state material. The basic idea is that the dielectric solid-state material, which is normally insulating, can be made to conduct through a filament or conduction path formed after application of a sufficiently high voltage. The conduction path can arise from different mechanisms, including vacancy or metal defect migration. Once the filament is formed, it may be reset (broken, resulting in high resistance) or set (re-formed, resulting in lower resistance) by another voltage. Many current paths, rather than a single filament, are possibly involved.

3D ReRAM is being commercialized as the next generation of non-volatile memory. However, as the number of layers used in forming 3D ReRAM goes up, high aspect ratio etching of a memory hole becomes more and more challenging. For example, high aspect ratio etching poses a higher requirement for hard mask selectivity. Also, high aspect ratio etching makes it difficult to have a uniform bottom trench and top trench critical dimension (CD). There is thus a need to provide a method of forming a 3D ReRAM that extends the etching aspect ratio limit and improves the top trench and bottom trench CD uniformity.

SUMMARY

Metal-assisted chemical etching is employed in the present application to form a 3D ReRAM in which the etching aspect ratio limit is extended and the top trench and bottom trench CD uniformity is improved. The 3D ReRAM includes a metal catalyst located between a bitline electrode and a selector device. Further, the 3D ReRAM includes vertically stacked and spaced apart replacement wordline electrodes that are located adjacent to the bitline electrode.

In one aspect of the present application, a memory structure is provided. In one embodiment, the memory structure includes a selector device located on a surface of a substrate. A vertical resistive random access memory (ReRAM) stack is embedded in a vertical stack of spaced apart wordline electrodes and is located above the selector device. The vertical ReRAM stack is electrically coupled to the selector device by a patterned metal catalyst. The selector device that can be employed in the present application includes a field effect transistor (FET), a bipolar transistor, a diode or a threshold switching device.

In another aspect of the present application, a method of forming a memory structure is provided. In one embodiment, the method includes forming a selector device on a surface of a substrate. A semiconductor material stack of alternating layers of a first semiconductor material and a second semiconductor material is then formed over the selector device. Next, a memory hole is formed in the semiconductor material stack, wherein the forming of the memory hole includes a metal-assisted chemical etching process utilizing a patterned metal catalyst which remains on the surface of the selector device after the forming of the memory hole. A vertical ReRAM stack is then formed in the memory hole and on a surface of the patterned metal catalyst. Next, each layer of the second semiconductor material is selectively removed from the semiconductor material stack and thereafter a wordline electrode is formed in each wordline cavity created during the selective removing of each of the layers of the second semiconductor material. Each layer of the first semiconductor material of the semiconductor material stack is then removed and thereafter a dielectric structure is formed above and below each wordline electrode.

BRIEF DESCRIPTION OF THE DRAWINGS

FIG. 4B is a top down view of the exemplary structure shown in FIG. 4A.

FIG. 5 is a cross sectional view of the exemplary structure shown of FIG. 4A after forming a dielectric switching material layer within the memory hole and atop the semiconductor material stack.

FIG. 6 is a cross sectional view of the exemplary structure of FIG. 5 after removing the dielectric switching material layer from all horizontal surfaces to provide a dielectric switching liner on the sidewall of the memory hole.

FIG. 7 is a cross sectional view of the exemplary structure of FIG. 6 after forming a bitline electrode in the remaining volume of the memory hole.

DETAILED DESCRIPTION

Figure 2:
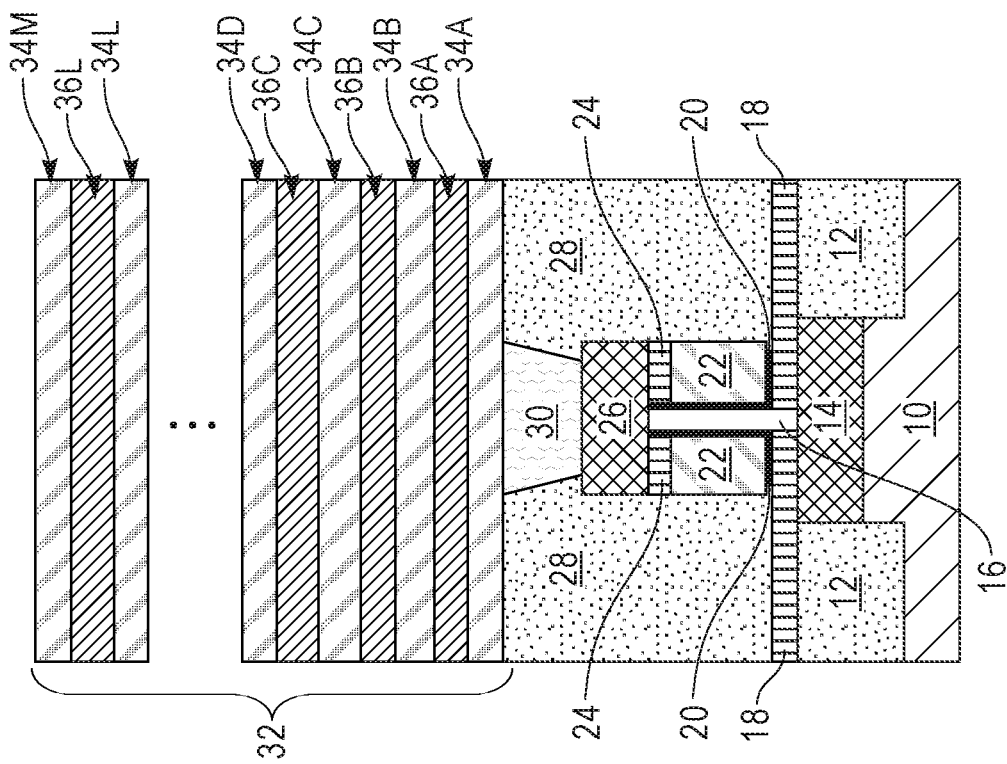
FIG. 2 is a cross sectional view of the exemplary structure of FIG. 1 after forming a semiconductor material stack of alternating layers of a first semiconductor material and a second semiconductor material on the MOL dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

A memory structure is provided that includes a selector device (i.e., FET, a bipolar transistor, a diode or a threshold switching device) located on a surface of a substrate. A vertical resistive random access memory (ReRAM) stack is embedded in a vertical stack of spaced apart wordline electrodes and is located above the selector device. The vertical ReRAM stack is electrically coupled to the selector device by a patterned metal catalyst.

Figure 1:
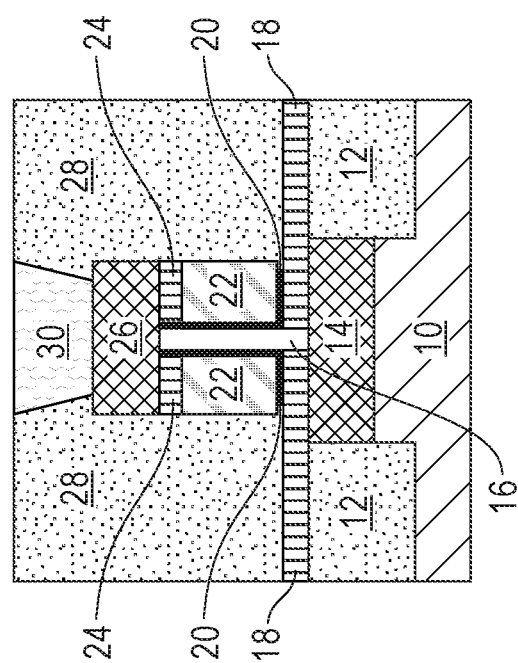
FIG. 1 is a cross sectional view of an exemplary structure that can be employed in accordance with an embodiment of the present application, the exemplary structure including a field effect transistor (FET), as a selector device, located on a surface of a substrate, a middle-of-the-line (MOL) dielectric material layer located laterally adjacent to the FET, and a source/drain contact structure embedded in the MOL dielectric material layer and contacting one of the source/drain regions of the FET.

Referring first to FIG. 1, there is illustrated an exemplary structure that can be employed in accordance with an embodiment of the present application. The exemplary structure includes a field effect transistor (FET), as a selector device, located on a surface of a substrate 10, a middle-of-the-line (MOL) dielectric material layer 28 located laterally adjacent to the FET, and a source/drain contact structure 30 embedded in the MOL dielectric material layer 28 and contacting one of the source/drain regions of the FET; in the illustrated embodiment, the source/drain region that the source/drain contact structure 30 contacts is a top source/drain region 26 of a vertical FET. Although the present application describes and illustrates a single FET, the present application works equally well when a plurality of FETs is used.

Although the present application describes and illustrates a FET as the selector device, the selector device is not limited to the same. Other types of selector devices such as, for example, bipolar transistors, diodes or threshold switching devices can be used in place of the FET. The other types of selector devices can be embedded in MOL dielectric material layer 28 and may include a contact structure in which the subsequently formed patterned metal catalyst and vertical ReRAM stack are formed thereon.

A FET is an electronic device which uses an electrical field to control the flow of current. FETs are devices with three terminals; a source region, a gate and a drain region. FETs control the flow of current by application of a voltage to the gate, which in turn, alters the conductivity between the source region and the drain region.

In the present application, the FET is a metal oxide semiconductor (MOS) field effect transistor. In one embodiment of the present application, the FET that can be used in the present application includes a planar FET. In another embodiment of the present application, the FET that is employed in the present application can include a non-planar FET such, as, for example, nanosheet FETs, nanowire FETs, vertical FETs, or FinFETs. The planar FETs or non-planar FETs that can be used in the present application include well known materials and can be formed using well known processing techniques. So as not to obscure the subject matter of the present application, the materials and techniques that can be used in providing the various FETs are not provided herein.

In FIG. 1, and for illustrative purposes, the FET is a vertical FET which is formed utilizing techniques that are well known to those skilled in the art. The vertical FET includes a semiconductor channel material pillar 16, a gate structure including a gate dielectric material layer 20, and a gate electrode structure 22 laterally adjacent to, and encircling, the semiconductor channel material pillar 16, a bottom source/drain region 14 located at a first end of the semiconductor channel material pillar 16, and a top source/drain region 26 located at a second end, which is opposite the first end, of the semiconductor channel material pillar 16. The vertical FET illustrated in FIG. 1 also includes a bottom dielectric spacer 18, and a top dielectric spacer 24. As is shown in FIG. 1, the source/drain contact structure 30 of the vertical FET is embedded in the MOL dielectric material layer 28 and has a surface that contacts the top source/drain region 26 of the vertical FET.

In some embodiments, a trench isolation structure 12, composed of a trench dielectric material such as, for example, silicon dioxide, can be present to define an active device region of the exemplary structure. The trench isolation structure 12 can be formed utilizing techniques that are well known to those skilled in the art.

In some embodiments, substrate 10 is a semiconductor substrate that includes at least one semiconductor material that has semiconducting properties. Examples of semiconductor materials that can provide substrate 10 include, for example, silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In the illustrated embodiment, substrate 10 is a semiconductor substrate such as, a silicon substrate.

In other embodiments and for other than the vertical FET illustrated in FIG. 1, the substrate 10 can include a buried insulator layer that is located on a handle substrate. In such an embodiment, the buried insulator layer and the handle substrate are components of a semiconductor-on-insulator (SOI) substrate. The SOI substrate further includes a top semiconductor material which can be processed to contain a channel (i.e., body) region of the FET.

In the illustrated embodiment, the semiconductor channel material pillar 16 may be composed of one of the semiconductor materials mentioned above for substrate 10. In some embodiments, semiconductor channel material pillar 16 can be composed of a compositionally same semiconductor material as substrate 10. In other embodiments, the semiconductor channel material pillar 16 can be composed of a semiconductor material that is compositionally different from the semiconductor material that provides substrate 10. The semiconductor channel material pillar 16 can have a vertical height from 20 nm to 300 nm, a width from 5 nm to 30 nm, and a length from 20 nm to 300 nm. Other vertical heights and/or widths and/or lengths that are lesser than, or greater than, the ranges mentioned herein can also be used in the present application.

In the illustrated embodiment, the bottom source/drain region 14 is composed of a semiconductor material, as defined above for substrate 10, and a dopant. The semiconductor material that provides the bottom source/drain region 14 can be compositionally the same as, or compositionally different from, the semiconductor material of either the substrate 10 or semiconductor channel material pillar 16. The dopant may be an n-type dopant or a p-type dopant. The term "n-type" denotes the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" denotes the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of dopant that is present in the bottom source/drain region 14 is typically from 5E19 atoms/cm$^3$ to 3E21 atoms/cm$^3$.

In the illustrated embodiment of FIG. 1, the bottom dielectric spacer 18 and the top dielectric spacer 24 are composed of a spacer dielectric material. The bottom dielectric spacer 18 and the top dielectric spacer 24 can be composed of a compositionally same, or a compositionally different, spacer dielectric material. In one embodiment, the spacer dielectric material that provides both the bottom dielectric spacer 18 and the top dielectric spacer 24 is composed of silicon nitride.

The gate dielectric layer 20 can be composed a gate dielectric material such as, for example, an oxide, nitride, and/or oxynitride. In one example, the gate dielectric material that provides the gate dielectric layer 20 can be composed of a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric layer 20. In one embodiment, the gate dielectric layer 20 can have a thickness in a range from 1 nm to 10 nm. Other thicknesses that are lesser than, or greater than, the aforementioned thickness range can also be employed for the gate dielectric layer 20.

The gate electrode structure 22 can be composed of a conductive material such as, for example, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g., $Ti_3Al$, ZrAl), TaC, TaMgC, or any suitable combination of these materials. The conductive material may further comprise dopants that are incorporated during deposition.

In some embodiments, a work function setting layer may be formed between the gate dielectric layer 20 and gate electrode structure 22. When present, the work function setting layer is composed of any suitable work function metal (WFM) containing material. Illustrative examples of WFM containing materials that can be employed include, but are not limited to, a nitride, such as, for example, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), a carbide, such as, for example, titanium carbide (TiC), titanium aluminum carbide (TiAlC), tantalum carbide (TaC), hafnium carbide (HfC), and combinations thereof.

In the illustrated embodiment of FIG. 1, the top source/drain region 26 is composed of a semiconductor material, as defined above for substrate 10, and a dopant. The semiconductor material that provides the top source/drain region 26 can be compositionally the same as, or compositionally different from, the semiconductor material of either the substrate 10 or semiconductor channel material pillar 16. The dopant may be an n-type dopant or a p-type dopant, as defined above. The concentration of dopant that is present in the top source/drain region 26 is typically from 5E19 atoms/cm$^3$ to 3E21 atoms/cm$^3$.

The MOL dielectric material layer 28 can be composed of any dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0; all dielectric constants are measured under vacuum unless otherwise stated herein). In another embodiment, a self-planarizing material such as a spin-on glass (SOG) or a spin-on low-k dielectric material can be used as the dielectric material for MOL dielectric material layer 28. The MOL dielectric material layer 28 can be formed utilizing a deposition process such as, for example, chemical vapor deposition (CVD), plasma enhanced chemical vapor deposition (PECVD), or spin-on coating.

In some embodiments, the source/drain contact structure 30 can be composed of a contact metal or contact metal alloy. Examples of contact metals include, but are not limited to, tungsten (W), aluminum (Al), copper (Cu), or cobalt (Co). An example of a contact metal alloy is Cu—Al alloy. In other embodiments, the source/drain contact structure 30 can be partially, or entirely, composed of a metal semiconductor alloy such as, for example, nickel silicide, platinum silicide, or tungsten silicide. As is shown, the source/drain contact structure 30 has a topmost surface that is coplanar with a topmost surface of the MOL dielectric material layer 28. The source/drain contact structure 30 can be formed by forming a contact opening in the MOL dielectric material layer 28, and then filling the contact opening with conductive material that provides the source/drain contact structure 30. In some embodiments, a planarization process can follow the filling of the contact opening with the conductive material that provides the source/drain contact structure 30.

Referring now to FIG. 2, there is illustrated the exemplary structure of FIG. 1 after forming a semiconductor material stack 32 of alternating layers of a first semiconductor material (e.g., first semiconductor material layers 34A, 34B, 34C, 34D, . . . 34M) and a second semiconductor material (e.g., second semiconductor material layers 36A, 36B, 36C, . . . 36L) on the MOL dielectric material layer 28 and above the selector device.

In the present application, the number of first semiconductor material layers and second semiconductor material layers of the semiconductor material stack 32 can vary so long as each second semiconductor layer is sandwiched between a bottom first semiconductor material layer and a top first semiconductor material layer. Thus, semiconductor material stack 32 includes 'n' second semiconductor material layers and n+1 first semiconductor material layers, wherein n is an integer greater than 1 (i.e., 2, 3, 4, etc.).

Each first semiconductor material layer (e.g., layers 34A, 34B, 34C, 34D, . . . 34M) of semiconductor material stack 32 is composed of a first semiconductor material, and each second semiconductor material layer (e.g., layers 36A, 36B, 36C, . . . 36L) of semiconductor material stack 32 is composed of a second semiconductor material that has a substantially same (within ±10%) etch rate during metal-assisted chemical etching as the first semiconductor material; the second semiconductor material layers however have a different etch rate than the first semiconductor material layers during other etching processes of the present application. Each first semiconductor material layer (e.g., layers 34A, 34B, 34C, 34D, . . . 34M) of semiconductor material stack 32 can be amorphous or polycrystalline, and each second semiconductor material layer (e.g., layers 36A, 36B, 36C, . . . 36L) of semiconductor material stack 32 can be amorphous or polycrystalline. In one embodiment of the present application, each first semiconductor material layer (e.g., layers 34A, 34B, 34C, 34D, . . . 34M) of semiconductor material stack 32 is composed of a polycrystalline silicon germanium alloy, and each second semiconductor material layer (e.g., layers 36A, 36B, 36C, . . . 36L) of semiconductor material stack 32 can be composed of polycrystalline silicon.

Each first semiconductor material layer (e.g., layers 34A, 34B, 34C, 34D, . . . 34M) of semiconductor material stack 32 can have a thickness from 5 nm to 100 nm, and each second semiconductor material layer (e.g., layers 36A, 36B, 36C, . . . 36L) of semiconductor material stack 32 can have a thickness from 5 nm to 100 nm.

Semiconductor material stack 32 can be formed utilizing, for example, a deposition process such as, for example, chemical vapor deposition (CVD), physical vapor deposition (PECVD), atomic layer deposition (ALD) or sputtering. In some embodiments, the semiconductor material is deposited as amorphous. A thermal annealing process such as laser annealing or flash annealing can be performed after the deposition to crystallize the material, i.e., to change from amorphous to crystalline.

Figure 3:
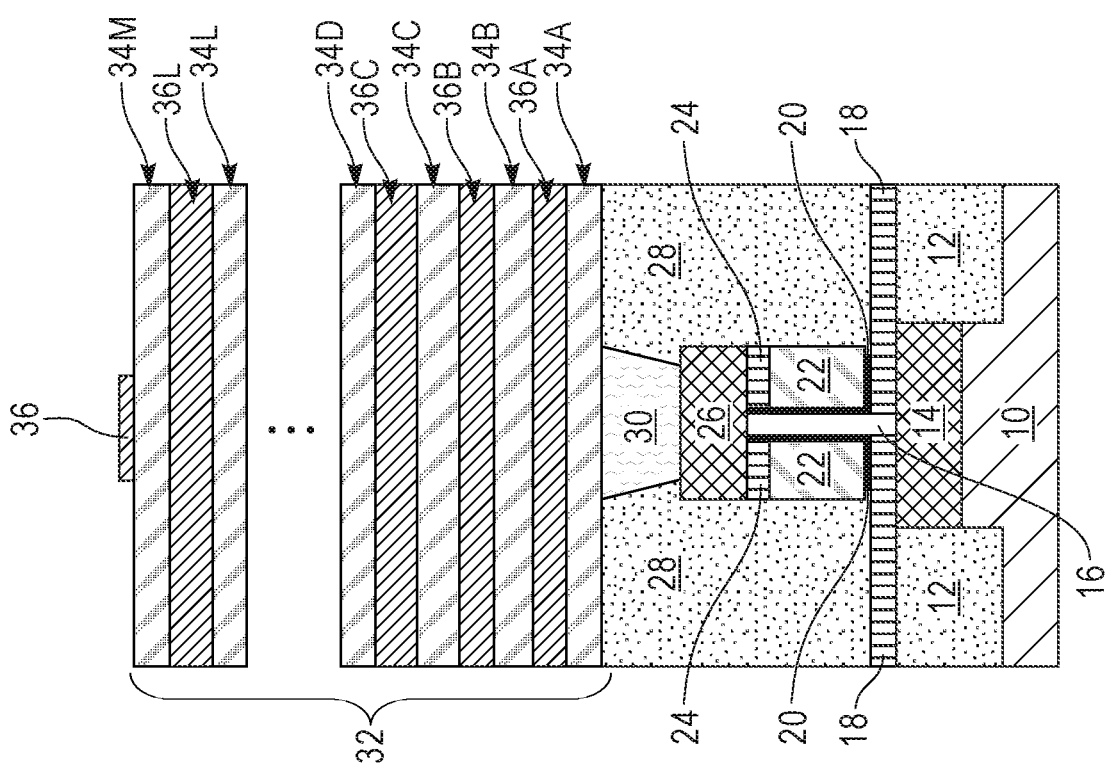
FIG. 3 is a cross sectional view of the exemplary structure of FIG. 2 after forming a patterned metal catalyst on a topmost surface of the semiconductor material stack.

Referring now to FIG. 3, there is illustrated the exemplary structure of FIG. 2 after forming a patterned metal catalyst 36 on a topmost surface of the semiconductor material stack 32; i.e., on a topmost surface of the topmost first semiconductor material layer (e.g., layer 34M). Although a single patterned metal catalyst 36 is described and illustrated, a plurality of patterned metal catalysts 36 can be formed and used in the present application to provide a plurality of memory holes in the semiconductor material stack 32.

The patterned metal catalyst 36 is composed of a noble metal that be used in metal-assisted chemical etching to etch a memory hole in the semiconductor material stack 32.

Illustrative noble metals that can be used as the patterned metal catalyst 36 include, but are not limited to, platinum (Pt), silver (Ag) or gold (Au).

The patterned metal catalyst 36 can be formed by first forming a blanket layer of metal catalyst on the topmost surface of the semiconductor material stack 32. The blanket layer of metal catalyst can be formed by a deposition process such as, for example, chemical vapor deposition (CVD), plasma enhanced chemical vapor deposition (PECVD), physical vapor deposition (PVD), sputtering, or plating. The blanket layer of metal catalyst can have a thickness from 5 nm to 50 nm; although other thicknesses for the blanket layer of metal catalyst are possible and can be used as the thickness of the blanket layer of metal catalyst.

After forming the blanket layer of metal catalyst, the blanket layer of metal catalyst is patterned. In some embodiments, patterning can include lithography and etching. Lithography includes forming a photoresist material on a material or material stack that needs to be patterned, exposing the photoresist material to a pattern of irradiation and developing the exposed photoresist. Etching includes an anisotropic etching process such as, for example, a reactive ion etch (RIE). In some embodiments, the patterned metal catalyst 36 is cylindrical in shape. Other shapes besides cylindrical can be used as the shape of the patterned metal catalyst 36.

Figure 4A:
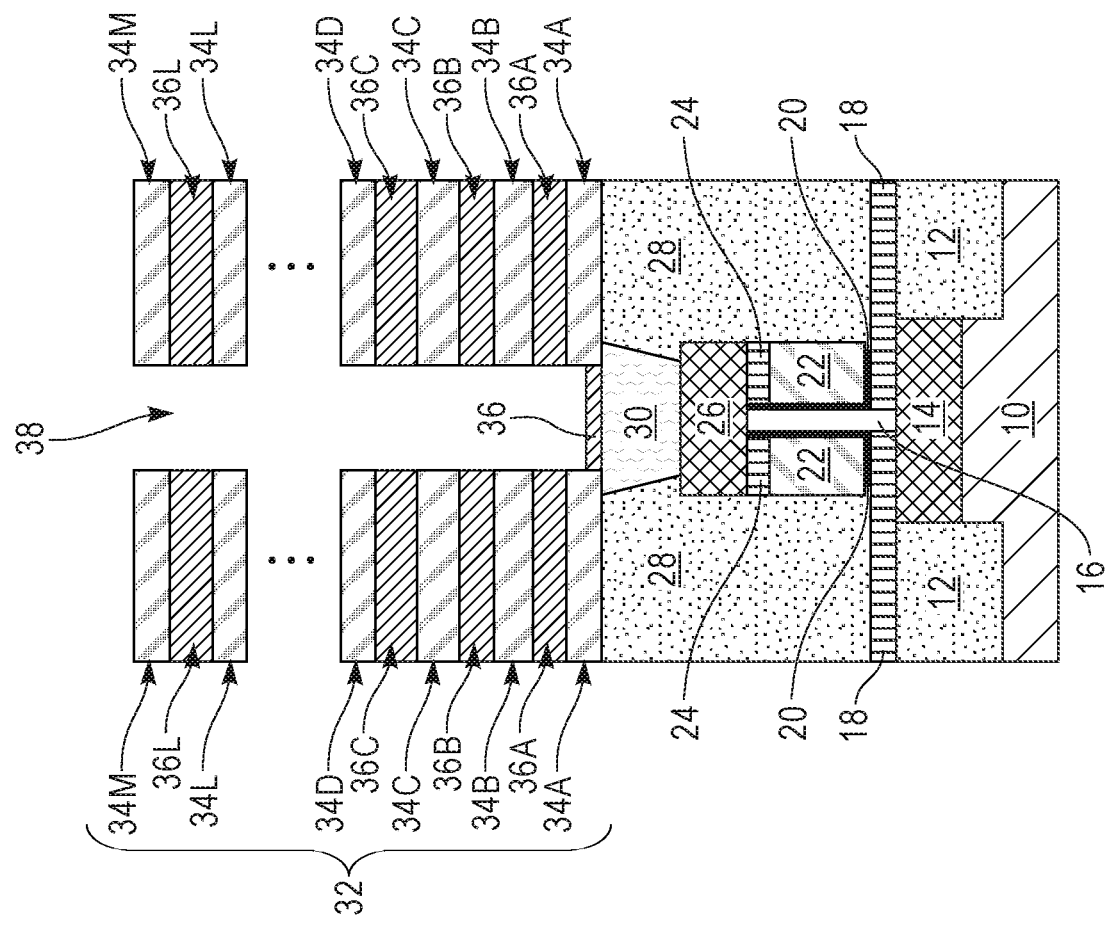
FIG. 4A is a cross sectional view of the exemplary structure of FIG. 3 after performing metal-assisted chemical etching to form a memory hole in the semiconductor material stack, the memory hole is located above a surface of the source/drain contact structure.

Referring now to FIG. 4A, there is illustrated the exemplary structure of FIG. 3 after performing metal-assisted chemical etching to form a memory hole 38 in the semiconductor material stack 22, the memory hole 38 is located above the selector device. FIG. 4B is a top down view of the exemplary structure shown in FIG. 4A. As shown, the patterned metal catalyst 36 is not entirely consumed during the metal-assisted chemical etching and it remains at the bottom of the memory hole 38. In the illustrated embodiment, the patterned metal catalyst 36 at the bottom of the memory hole 38 is present on the source/drain contact structure 30 of the FET. Although a single memory hole 38 is possible, the present application works when a plurality of memory holes 28, as shown in FIG. 4B, is formed. In embodiments in which other selector devices besides a FET is used, the patterned metal catalyst that remains in the bottom of the memory hole 38 contacts a surface of the other selector device.

Metal-assisted chemical etching includes providing an etching solution that chemical reacts with the patterned metal catalyst 36 to etch the semiconductor material stack 32. The etching solution may contain, for example, sulfuric acid ($H_2SO_4$), potassium permanganate ($KMnO_4$) serving as an oxidant, and deionized water. In the etching solution, a molar concentration ratio of $H_2SO_4$ to KMnO4 may range from 200:1 to 1000:1. In certain embodiments, the etching solution may contain hydrogen fluoride (HF) and hydrogen peroxide ($H_2O_2$) serving as an oxidant. The process of metal-assisted chemical etching the semiconductor material stack 22 may be performed at a process temperature of 0° C. to 50° C.

Each memory hole 38 that is formed has an aspect ratio from 10 to 100. In some embodiments, the aspect ratio of each memory hole 38 is greater than 100. Each memory hole 38 has a substantially same shape as the patterned metal catalyst 36. Thus, and in some embodiments, each memory hole 38 is cylindrical in shape. See, for example, FIG. 4B. Each memory hole 38 has a uniform CD, from top to bottom, and the CD of each memory hole 38 is typically less than the CD of the underlying source/drain contact structure 30.

Referring now to FIG. 5, there is illustrated the exemplary structure of FIG. 4A after forming a dielectric switching material layer 40 within the memory hole 38 and atop the semiconductor material stack 32. As is shown, the dielectric switching material layer 40 is present on the sidewall of the memory hole 38 and on a topmost surface of the patterned metal catalyst 36 that is present at the bottom of the memory hole 38.

The dielectric switching material layer 40 (which may also be referred to as a filament forming material) is composed of any dielectric material that can be used in a ReRAM device such as, for example, a dielectric metal oxide that has a dielectric constant of greater than 4.0. The dielectric switching material layer 40 is electrically insulating, but can be converted into a filament that is electrically conducting during application of a high voltage. The filament can be reset and set numerous times using various applied voltages. Examples of dielectric metal oxides that can be employed as the dielectric switching material layer 40 include, but are not limited to, hafnium oxide ($HfO_x$), tantalum oxide ($TaO_x$), titanium oxide ($TiO_x$), aluminum oxide ($AlO_x$), or combinations thereof. Dielectric switching material layer 40 can be formed utilizing a deposition process such as, for example, CVD, PECVD, ALD, chemical solution deposition or evaporation. The dielectric switching material layer 40 can have a thickness from 1 nm to 50 nm; other thicknesses however are contemplated can be used as the thickness of the dielectric switching material layer 40.

Referring now to FIG. 6, there is illustrated the exemplary structure of FIG. 5 after removing the dielectric switching material layer 40 from all horizontal surfaces to provide a dielectric switching liner 40L on the sidewall of the memory hole 38. The dielectric switching material layer 40 can be removed for all horizontal surfaces of the exemplary structure of FIG. 5 utilizing a directional etching process such as, for example a reactive ion etch or a sputter etch. Dielectric switching liner 40L has a topmost surface that is substantially coplanar with (within ±10%) the topmost surface of the semiconductor material stack 32.

Referring now to FIG. 7, there is illustrated the exemplary structure of FIG. 6 after forming a bitline electrode 42 in the remaining volume of the memory hole 38. The bitline electrode 42 is a vertical pillar having a bottommost surface that contacts a surface of the patterned metal catalyst 36 that remains at the bottom of the memory hole 38. The patterned metal catalyst 36 electrically couples the bitline electrode 42 to the selector device. In the illustrated embodiment, the patterned metal catalyst 36 electrically couples the bitline electrode 42 to the source/drain contact structure 30 of a FET. The bitline electrode 42 is formed laterally adjacent to the dielectric switching liner 40L that is also present in the memory hole 38.

The bitline electrode 42 can be composed of titanium nitride (TiN), tantalum nitride (TaN), tungsten (W), tungsten nitride (WN), or a (M)AlC containing stack, wherein M is a transition metal selected from the group consisting of titanium (Ti), tantalum (Ta) and niobium (Nb). The bitline electrode 42 can be formed by a deposition process such as, for example, sputtering, electroplating, electroless plating, CVD, PECVD or PVD. In some embodiments, a planarization process such as, for example chemical mechanical polishing (CMP), follows the deposition of the electrode material that provides the bitline electrode 42.

The bitline electrode 42 has a same shape as the memory hole 38. In one embodiment, the bitline electrode 42 is cylindrical in shape (see, for example, FIG. 8B). The biltline electrode 42 has a CD that is less than the CD of the source/drain contact structure 30. In some embodiments, the bitline electrode 42 has a topmost surface that is coplanar within the topmost surface of the dielectric switching liner 40L as well as a topmost surface of the semiconductor material stack 32. Collectively, the bitline electrode 42 and the dielectric switching liner 40L form a vertical ReRAM stack. As is shown, the vertical ReRAM stack (40L, 42) is embedded in the semiconductor material stack 32 and is contact with the patterned metal catalyst 36. The vertical ReRAM stack (40L, 42) is electrically coupled to the underlying selector device by the patterned metal catalyst 36.

Figure 8B:
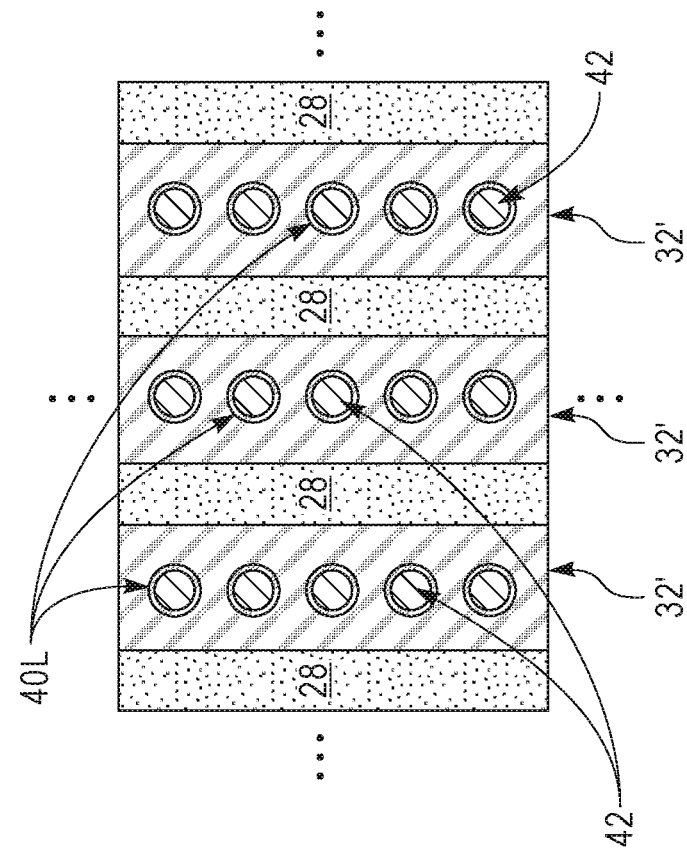
FIG. 8B is a top down view of the exemplary structure shown in FIG. 8A.
Figure 8A:
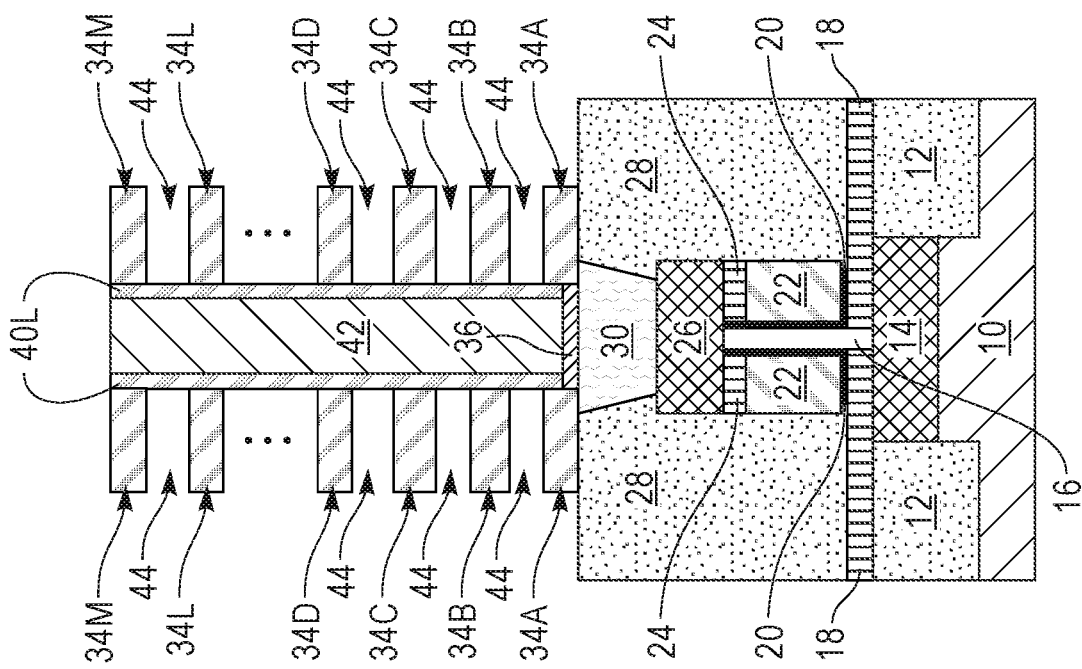
FIG. 8A is a cross sectional view of the exemplary structure of FIG. 7 after performing a wordline slit cut and selectively removing each layer of the second semiconductor material from each of the cut semiconductor material stacks.

Referring now to FIG. 8A, there is illustrated the exemplary structure of FIG. 7 after performing a wordline slit cut and selectively removing each layer of the second semiconductor material (e.g., second semiconductor material layers 36A, 36B, 36C, . . . 36L) from each of the now cut semiconductor material stacks 32'. FIG. 8B is a top down view of the exemplary structure shown in FIG. 8A. The wordline slit cut can be omitted in some embodiments of the present application.

When needed, the wordline slit cut can be performed by lithography and etching. During the wordline slit cut, the semiconductor material stack 32 is cut as shown in FIG. 8B so as to provide a gap that is located between each of the cut semiconductor material stacks 32'. The cut semiconductor material stacks 32' are oriented parallel to one other. Each of the cut semiconductor material stacks 32' includes at least one vertical ReRAM stack (40L, 42) embedded therein.

Each layer of the second semiconductor material (e.g., second semiconductor material layers 36A, 36B, 36C, . . . 36L) can be removed after the wordline slit cut utilizing an etching process (dry etching or wet chemical etching) that is selective in removing each layer of the second semiconductor material (e.g., second semiconductor material layers 36A, 36B, 36C, . . . 36L). In one embodiment, and when each layer of the second semiconductor material (e.g., second semiconductor material layers 36A, 36B, 36C, . . . 36L) is composed of silicon, and each layer of the first semiconductor material (e.g., first semiconductor material layers 34A, 34B, 34C, 34D, . . . 34M) is composed of SiGe, then a dry etch in a $CF_4/N_2/O_2$ gas mixture can be used to selectively remove each layer of the second semiconductor material (e.g., second semiconductor material layers 36A, 36B, 36C, . . . 36L).

As is shown in FIG. 8B, each cut semiconductor material stack 32' contains spaced apart layers of the first semiconductor material (e.g., first semiconductor material layers 34A, 34B, 34C, 34D, . . . 34M). In FIG. 8B, element 44 designates a wordline cavity that is located between each of the cut layers of the first semiconductor material (e.g., first semiconductor material layers 34A, 34B, 34C, 34D, . . . 34M).

Figure 9:
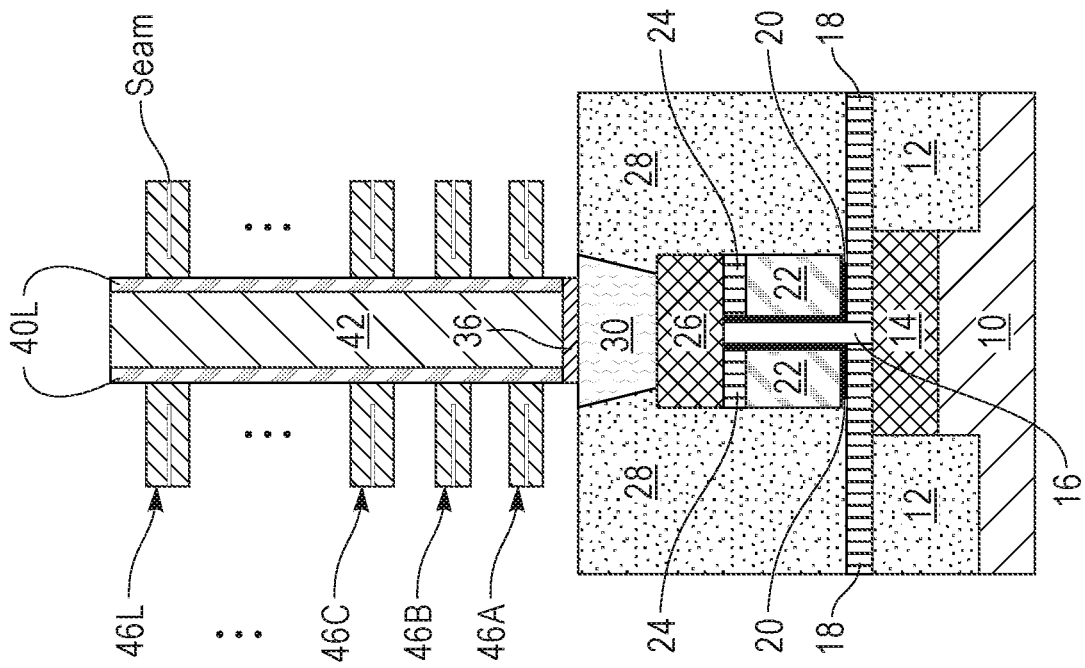
FIG. 9 is a cross sectional view of the exemplary structure of FIG. 8A after forming a wordline electrode in each wordline cavity created during the selective removal of each of the layers of the second semiconductor material.

Referring now to FIG. 9, there is illustrated the exemplary structure of FIG. 8A after forming a wordline electrode (e.g., wordline electrodes 46A, 46B, 46C, . . . 46L) in each wordline cavity 44 created during the selective removal of each of the layers of the second semiconductor material (e.g., second semiconductor material layers 36A, 36B, 36C, . . . 36L). In some embodiments, and as shown in FIG. 9, a seam can be present in each wordline electrode (e.g., wordline electrodes 46A, 46B, 46C, . . . 46L). Each wordline electrode (e.g., wordline electrodes 46A, 46B, 46C, . . . 46L) encapsulates a portion of the vertical ReRAM stack (40L, 42) and is oriented along a horizontal plane.

Each wordline electrode can be formed by first depositing a wordline electrode conductive material, and thereafter isotropic etching the deposited wordline electrode conductive material. The depositing of the wordline electrode conductive material can include ALD or CVD. The wordline electrode conductive material can include, for example, titanium nitride (TiN), tantalum nitride (TaN), tungsten (W), tungsten nitride (WN), or platinum (Pt). The wordline electrode conductive material can be compositionally the same as, or compositionally different from the bitline electrode 42.

Figure 10:
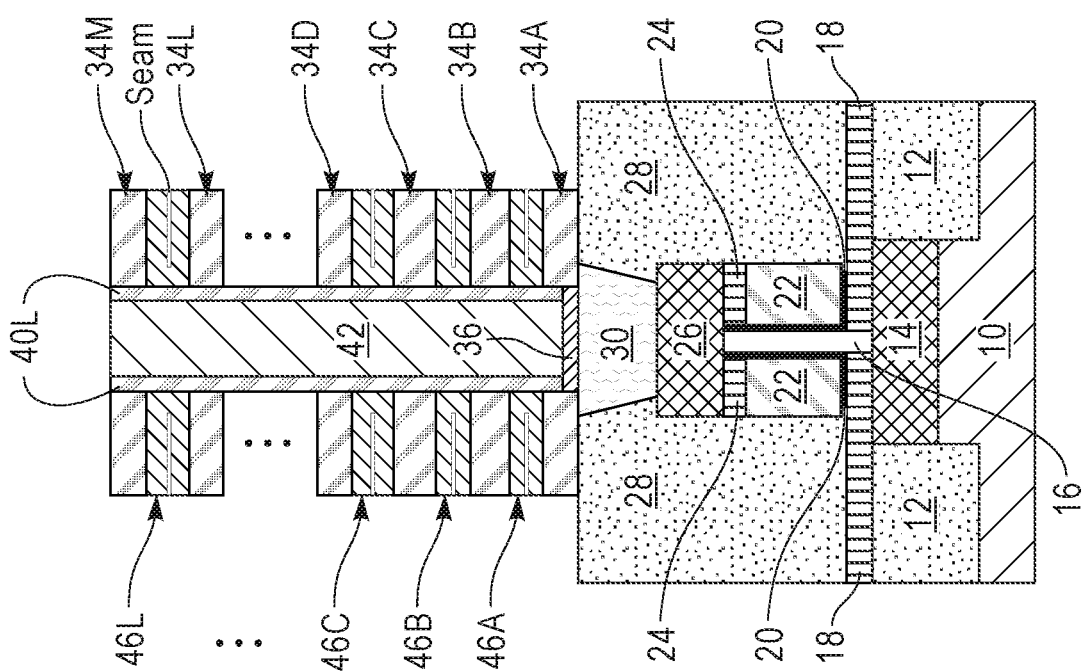
FIG. 10 is a cross sectional view of the exemplary structure of FIG. 9 after selectively removing each layer of the first semiconductor material from each of the cut semiconductor material stacks.

Referring now to FIG. 10, there is illustrated the exemplary structure of FIG. 9 after selectively removing each layer of the first semiconductor material (e.g., first semiconductor material layers 34A, 34B, 34C, 34D, . . . 34M) from each of the cut semiconductor material stacks 32'. Each layer of the first semiconductor material (e.g., first semiconductor material layers 34A, 34B, 34C, 34D, . . . 34M) can be removed utilizing an etching process (dry etching or wet chemical etching) that is selective in removing each layer of the first semiconductor material (e.g., first semiconductor material layers 34A, 34B, 34C, 34D, . . . 34M). In one embodiment, and when each layer of the first semiconductor material (e.g., first semiconductor material layers 34A, 34B, 34C, 34D, . . . 34M) is composed of SiGe, then a wet etch in a solution of ammonia and hydrogen peroxide can be used to selectively remove each layer of the first semiconductor material (e.g., first semiconductor material layers 34A, 34B, 34C, 34D, . . . 34M).

After removing each layer of the first semiconductor material (e.g., first semiconductor material layers 34A, 34B, 34C, 34D, . . . 34M), a vertical stack of suspended wordline electrodes (e.g., wordline electrodes 46A, 46B, 46C, . . . 46L) is provided in which a gap is located between each wordline electrode (e.g., wordline electrodes 46A, 46B, 46C, . . . 46L).

Figure 11:
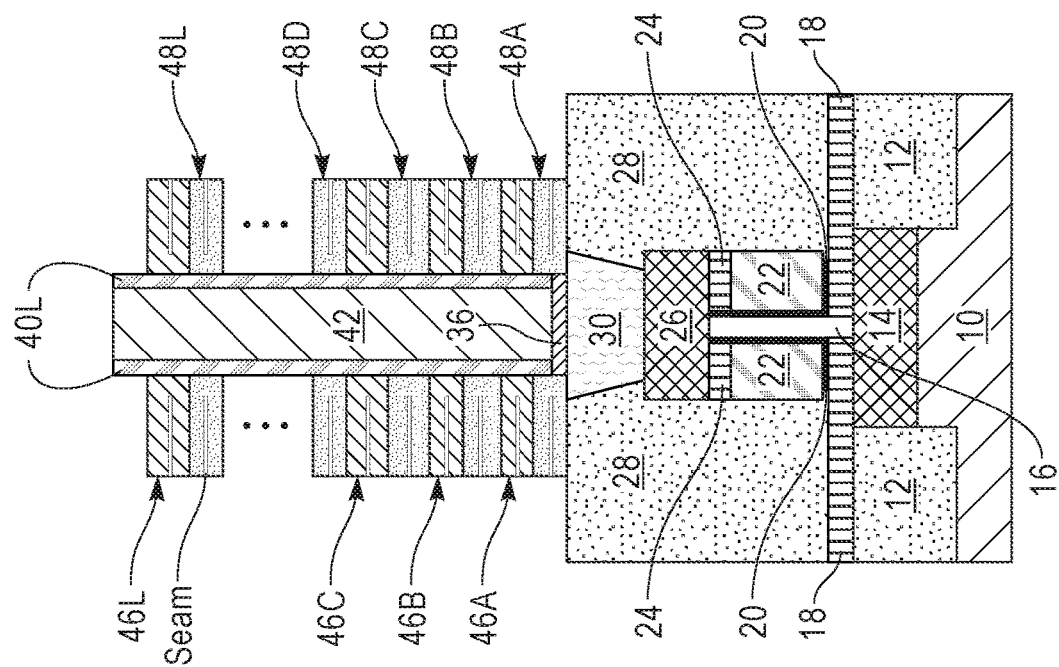
FIG. 11 is a cross sectional view of the exemplary structure of FIG. 10 after forming a dielectric structure above and below each wordline electrode.

Referring now to FIG. 11, there is illustrated the exemplary structure of FIG. 10 after forming a dielectric structure (e.g., dielectric structures 48A, 48B, 48C, 48D, . . . 48L) above and below each wordline electrode (e.g., wordline electrodes 46A, 46B, 46C, . . . 46L); a dielectric structure is provided in each gap that is located each wordline electrode. Each dielectric structure (e.g., dielectric structures 48A, 48B, 48C, 48D, . . . 48L) can be referred to herein as a wordline separation dielectric structure.

Each dielectric structure (e.g., dielectric structures 48A, 48B, 48C, 48D, . . . 48L) is composed of a dielectric material such as, for example, silicon dioxide, silicon nitride, silicon oxynitride or any suitable combination of multiple layers of dielectric materials. Each dielectric structure (e.g., dielectric structures 48A, 48B, 48C, 48D, . . . 48L) can be formed by depositing a dielectric material and then isotropic etching the dielectric material. In some embodiments, each dielectric structure (e.g., dielectric structures 48A, 48B, 48C, 48D, . . . 48L) has a seam located thereon. The depositing of the dielectric material(s) that provide(s) the dielectric structures can include CVD or ALD.

In some embodiments, each dielectric structure (e.g., dielectric structures 48A, 48B, 48C, 48D, . . . 48L) is a dielectric air gap that is formed by forming an air-gap sealant layer laterally adjacent to the vertical stack of suspended wordline electrodes (e.g., wordline electrodes 46A, 46B, 46C, . . . 46L).

In some embodiments and as is shown in FIG. 11, the wordline electrodes (e.g., wordline electrodes 46A, 46B, 46C, . . . 46L) have a sidewall surface that is vertically aligned to a sidewall of each of the dielectric structures (e.g., dielectric structures 48A, 48B, 48C, 48D, . . . 48L).

FIG. 11 illustrates a memory structure in accordance with the present application. The illustrated memory structure shown in FIG. 11 includes a FET (e.g., vertical FET) located on a surface of a substrate 10, wherein a MOL dielectric material layer 28 is located laterally adjacent to the FET, and a source/drain contact structure 30 is embedded in the MOL dielectric material layer 28 and contacts a source/drain region (e.g., top source/drain region 26) of the FET. A vertical ReRAM stack (40L, 42) is embedded in a vertical stack of spaced apart wordline electrodes (e.g., wordline electrodes 46A, 46B, 46C, . . . 46L) and is located above the FET. The vertical ReRAM stack (40L, 42) is spaced apart from the source/drain contact structure 30 by a patterned metal catalyst 36.

Figure 12:
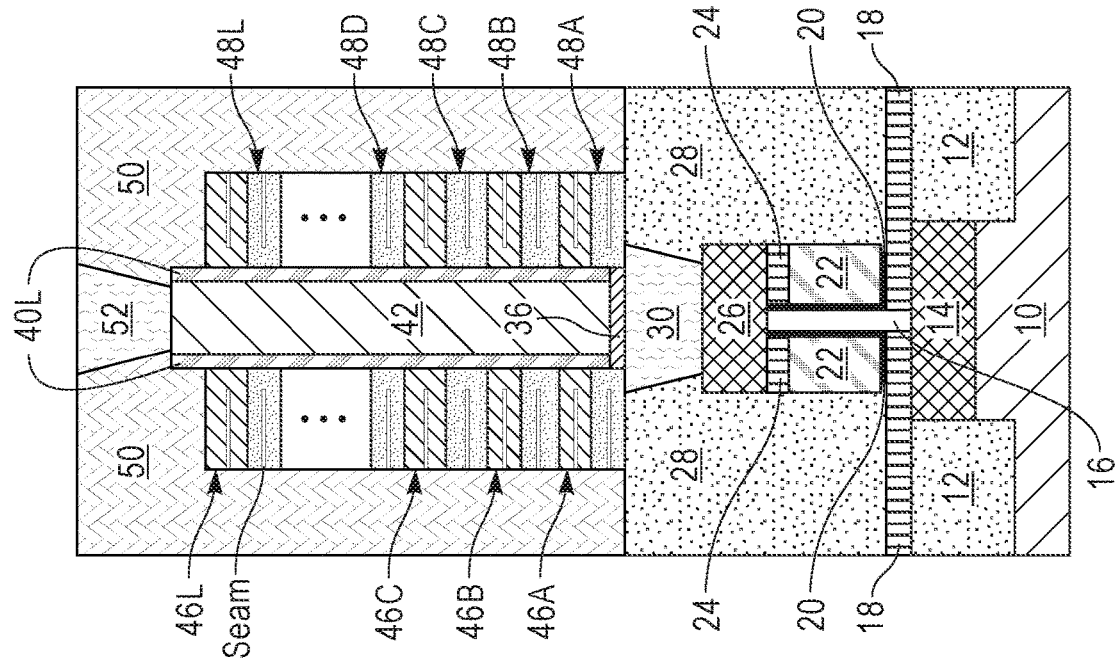
FIG. 12 is a cross sectional view of the exemplary structure of FIG. 11 after forming an interlayer dielectric (ILD) material layer, and forming a bitline contact contacting a surface of the bitline electrode.

Referring now to FIG. 12, there is illustrated the exemplary structure of FIG. 11 after forming an interlayer dielectric (ILD) material layer 50, and forming a bitline contact structure 52 contacting a surface of the bitline electrode 42. ILD material layer 50 is formed laterally adjacent to the vertical stacked wordline electrodes (e.g., wordline electrodes 46A, 46B, 46C, . . . 46L) and has a height that is located above the topmost surface of the bitline electrode 42. Although a single bitline contact structure 52 is shown, a plurality of bitline contact structures 52 can be formed each contacting one of the bitline electrodes 42 of the exemplary structure.

The ILD material layer 50 can be composed of one of the dielectric materials mentioned above for MOL dielectric material layer 28. In some embodiments, the ILD material layer 50 is composed of a compositionally same dielectric material as the MOL dielectric material layer 28. In other embodiments, the ILD material layer 50 is composed of a dielectric material that is compositionally different from the MOL dielectric material layer 28. The ILD material layer 50 can be formed by a deposition process such as, for example, CVD, PECVD or spin-on coating.

The bitline contact structure 52 is then formed into the ILD material layer 50 by first forming a bitline contact opening in the ILD material layer 50 and thereafter filling the bitline contact opening with a bitline contact metal or bitline contact metal alloy. Examples of bitline contact metals include, but are not limited to, tungsten (W), aluminum (Al), copper (Cu), or cobalt (Co). An example of a bitline contact metal alloy is Cu—Al alloy. In some embodiments, a planarization process can follow the filling of the bitline contact opening with the bitline contact metal or bitline contact metal alloy.

Although not shown, wordline contact structures can be formed at this point of the present application by forming wordline contact openings in the ILD material layer 50, and filling the wordline contact openings with a wordline line contact metal or wordline contact metal alloy. Examples of wordline contact metals include, but are not limited to, tungsten (W), aluminum (Al), copper (Cu), or cobalt (Co). An example of a wordline contact metal alloy is Cu—Al alloy. In some embodiments, a planarization process can follow the filling of the wordline contact opening with the wordline contact metal or wordline contact metal alloy.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
    a selector device located on surface of a substrate; and
    a vertical resistive random access memory (ReRAM) stack embedded in a vertical stack of spaced apart wordline electrodes and located above the selector device, wherein the vertical ReRAM stack is electrically coupled to the selector device by a patterned metal catalyst, and wherein the vertical ReRAM stack comprises a dielectric switching liner and a bitline electrode, wherein the dielectric switching liner is located on a sidewall of the bitline electrode, and the patterned metal catalyst is located entirely beneath both the dielectric switching liner and the bitline electrode of the vertical ReRAM stack.

2. The memory structure of claim 1, further comprising a dielectric structure located below and above each of the spaced apart wordline electrodes.

3. The memory structure of claim 2, wherein the dielectric structure comprises a dielectric material having a seam located therein.

4. The memory structure of claim 1, wherein each wordline electrode comprises a wordline electrode conductive material having a seam located therein.

5. The memory structure of claim 1, wherein the bitline electrode is cylindrical in shape.

6. The memory structure of claim 1, further comprising a bitline contact structure contacting a surface of the bitline electrode.

7. The memory structure of claim 1, wherein the patterned metal catalyst is composed of a noble metal that catalyzes a metal-assisted chemical etching process.

8. The memory structure of claim 1, wherein selector device is a field effect transistor (FET), a bipolar transistor, a diode or a threshold switching device.

9. The memory structure of claim 1, wherein the selector device is a vertical FET comprising a semiconductor channel material pillar, a gate structure laterally adjacent to, and encircling, the semiconductor channel material pillar, a bottom source/drain region located at a first end of the semiconductor channel material pillar, and a top source/drain region located at a second end, which is opposite the first end, of the semiconductor channel material pillar.

* * * * *